(12) United States Patent
Gao et al.

(10) Patent No.: US 7,843,074 B2
(45) Date of Patent: Nov. 30, 2010

(54) UNDERFILL FOR LIGHT EMITTING DEVICE

(75) Inventors: Xiang Gao, Edison, NJ (US); Michael Sackrison, Bethlehem, PA (US); Hari S. Venugopalan, Somerset, NJ (US)

(73) Assignee: Lumination LLC, Cleveland, OH (US)

( * ) Notice: Subject to any disclaimer, the term of this patent is extended or adjusted under 35 U.S.C. 154(b) by 1021 days.

(21) Appl. No.: 11/519,402

(22) Filed: Sep. 12, 2006

(65) Prior Publication Data

US 2008/0061312 A1    Mar. 13, 2008

(51) Int. Cl.
H01L 23/48 (2006.01)
H01L 23/52 (2006.01)
H01L 29/40 (2006.01)

(52) U.S. Cl. .................. 257/779; 257/783; 257/E23.04

(58) Field of Classification Search .................. 257/778, 257/779, 780, 782, 783, 789, E23.04
See application file for complete search history.

(56) References Cited

U.S. PATENT DOCUMENTS

| 5,780,321 | A | 7/1998 | Shieh et al. |
| 6,049,124 | A * | 4/2000 | Raiser et al. ................. 257/712 |
| 6,071,795 | A | 6/2000 | Cheung et al. |
| 6,964,877 | B2 | 11/2005 | Chen et al. |
| 7,078,319 | B2 | 7/2006 | Eliashevich et al. |
| 2005/0023550 | A1 | 2/2005 | Eliashevich et al. |
| 2005/0025435 | A1* | 2/2005 | Miyamae ..................... 385/88 |
| 2006/0030125 | A1 | 2/2006 | Sackrison et al. |
| 2006/0091409 | A1 | 5/2006 | Epler et al. |
| 2008/0113460 | A1* | 5/2008 | Shelton et al. ................ 438/28 |

OTHER PUBLICATIONS

Miskys et al., Freestanding GaN-substrates and devices, phys. stat. sol. (c) 0, No. 6, 1627-1650 (2003).

* cited by examiner

*Primary Examiner*—Hoai v Pham
(74) *Attorney, Agent, or Firm*—Fay Sharpe LLP

(57) ABSTRACT

A light emitting chip is disposed on a support surface. A plurality of bonding bumps are disposed in a gap between the light emitting chip and the support surface. The plurality of bonding bumps provide at least one electrical power input path to the light emitting chip. An underfill comprising underfill material is disposed in the gap between the light emitting chip and the support surface such that the underfill substantially fills the gap but does not form a fillet extending outside the gap over sidewalls of the light emitting chip. The underfill is configured to provide at least one of (i) mechanical support for the light emitting chip and (ii) a thermal conduction path from the light emitting chip to the support surface.

10 Claims, 5 Drawing Sheets

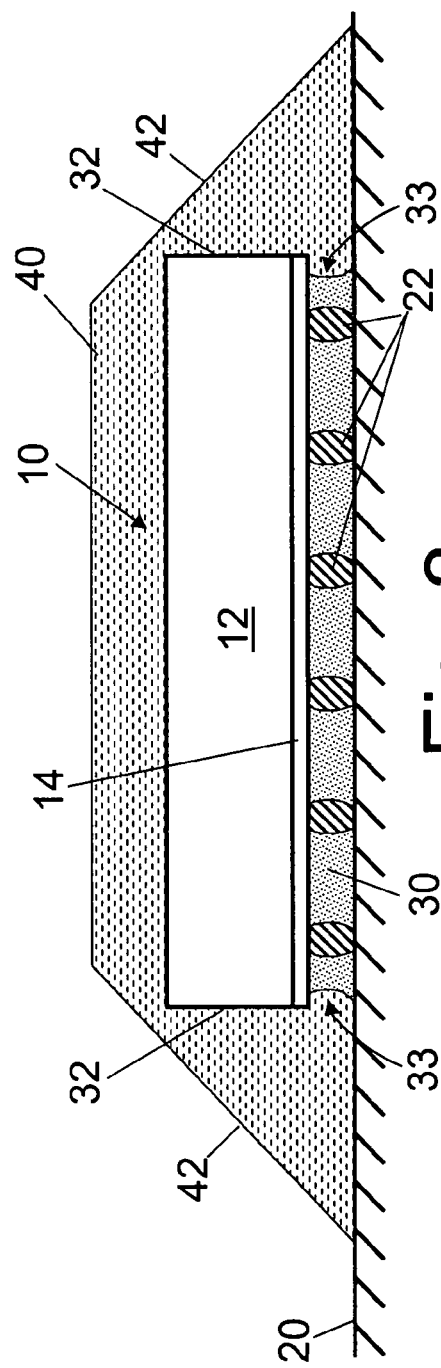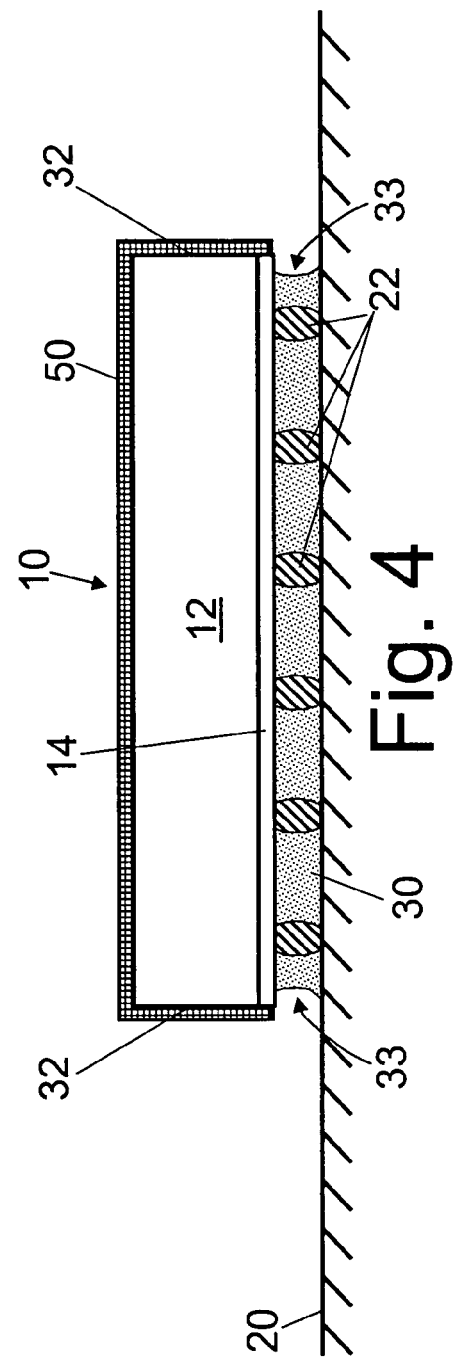

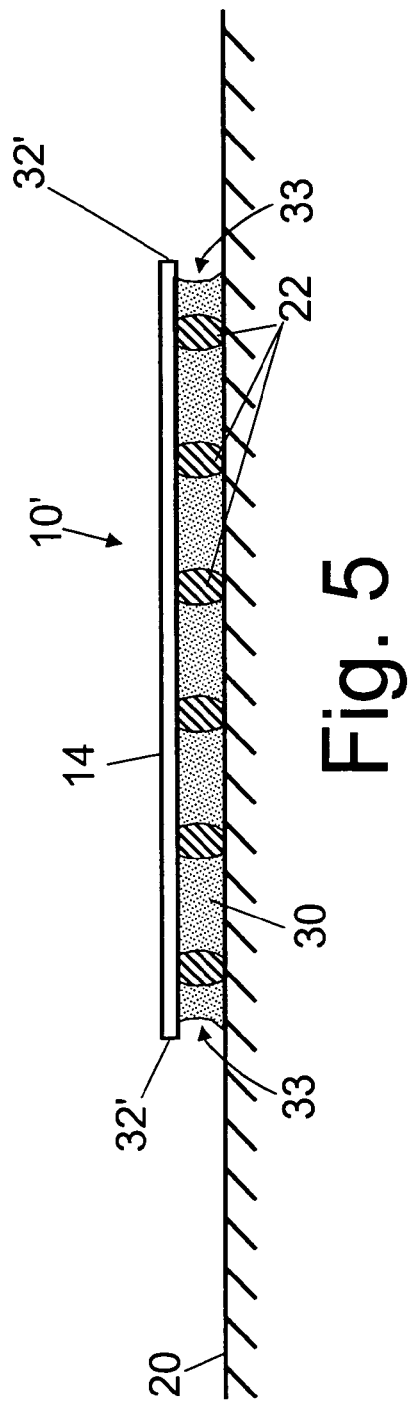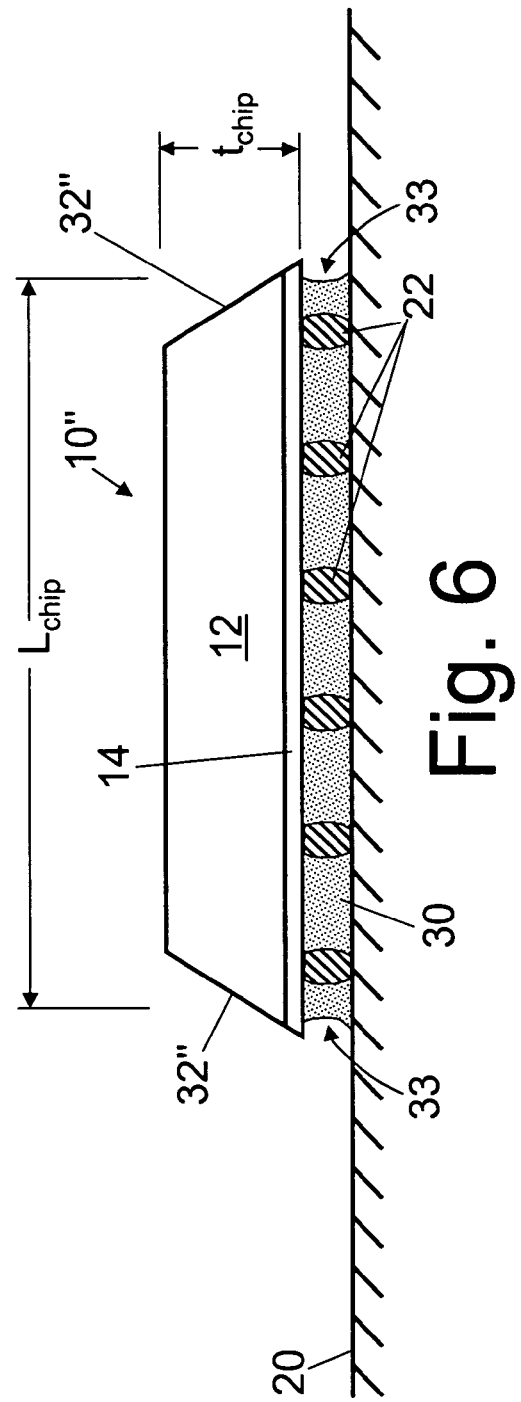

UNDERFILL FOR LIGHT EMITTING DEVICE

BACKGROUND

The following relates to optical devices. It finds particular application in conjunction with the mounting or packaging of high-power light emitting diode chips, and will be described with particular reference thereto. The following finds more general application in conjunction with mounting or packaging of light emitting chips generally, such as mounting or packaging light emitting diode chips generally, light emitting semiconductor laser chips, non-semiconductor-based light emitting chips such as organic-based light emitting diode chips, and so forth.

Semiconductor chips are routinely mounted or packaged by securing the chip to a support surface of printed circuit board, sub-mount, or other support that provides structural support and thermal heat sinking. In a common approach, the chip includes electrodes disposed on a side of the chip to be bonded to the support, and electrically conductive bonding bumps are formed either on the chip or on the support. The chip is then bonded to the bonding bumps, simultaneously providing mechanical securing of the chip to the support and electrical connection of the electrodes of the chip to printed circuitry or other electrically conductive paths on or in the support.

In securing a semiconductor chip to a support, it is known to dispose an underfill material of epoxy, resin, or another formable material between the chip and the support. Such an underfill material can be applied before the chip is secured to the support, or after it is secured by injecting the underfill material into the gaps between the secured chip and the support. The underfill material provides enhanced mechanical support, provides elasticity to accommodate mechanical strain introduced by differential thermal expansion, and enhances thermal contact between the chip and the support.

The following discloses improved underfill techniques for light emitting chips, and light emitting devices incorporating same.

BRIEF DESCRIPTION

Example device and method embodiments are disclosed.

In an example light emitting device embodiment, a light emitting chip is disposed on a support surface. A plurality of bonding bumps are disposed in a gap between the light emitting chip and the support surface. The plurality of bonding bumps provide at least one electrical power input path to the light emitting chip. An underfill comprises underfill material disposed in the gap between the light emitting chip and the support surface. The underfill substantially fills the gap but does not include a fillet extending outside the gap over sidewalls of the light emitting chip. The underfill provides at least one of (i) mechanical support for the light emitting chip and (ii) a thermal conduction path from the light emitting chip to the support surface.

In an example method embodiment, a light emitting chip is disposed on a support surface. A plurality of bonding bumps are disposed in a gap between the light emitting chip and the support surface. The plurality of bonding bumps provide at least one electrical power input path to the light emitting chip. An underfill comprising underfill material is disposed in the gap between the light emitting chip and the support surface such that the underfill substantially fills the gap but does not form a fillet extending outside the gap over sidewalls of the light emitting chip. The underfill is configured to provide at least one of (i) mechanical support for the light emitting chip and (ii) a thermal conduction path from the light emitting chip to the support surface.

BRIEF DESCRIPTION OF THE DRAWINGS

FIG. 3 diagrammatically shows a side view of a light emitting device constructed from the light emitting device of FIGS. 1 and 2 by adding a shaped encapsulant that promotes extraction of side-emitted light.

FIG. 4 diagrammatically shows a side view of a light emitting device constructed from the light emitting device of FIGS. 1 and 2 by adding an antireflective coating applied to the chip including the sidewalls to promote light extraction.

FIG. 5 diagrammatically shows a side view of a light emitting device constructed from the light emitting device of FIGS. 1 and 2 by removing the substrate.

FIG. 6 diagrammatically shows a side view of a light emitting device similar to the device of FIGS. 1 and 2, but having slanted sidewalls.

FIGS. 1-6 are not drawn to scale or proportion.

DETAILED DESCRIPTION

Figure 1:
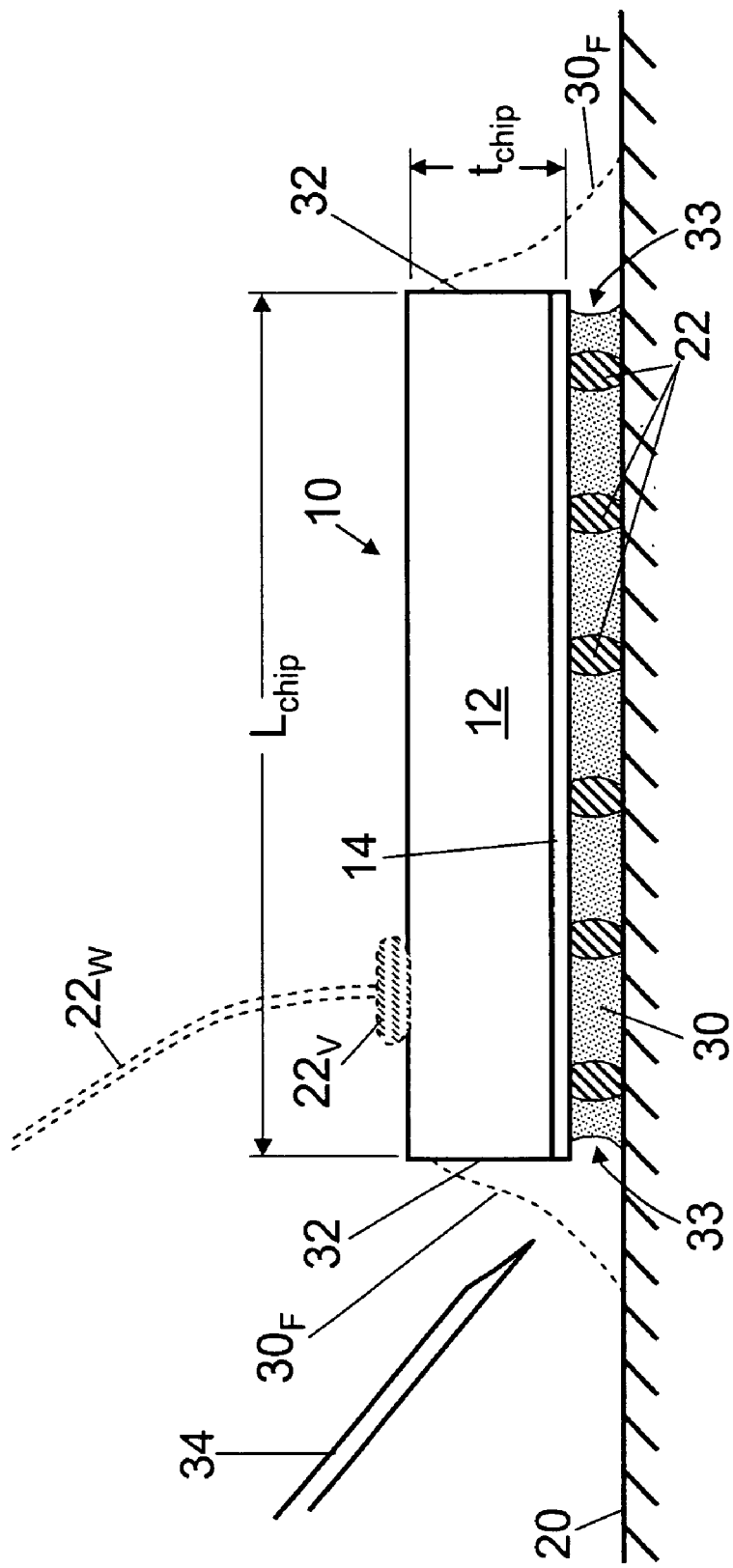
FIGS. 1 and 2 diagrammatically show side and perspective views, respectively, of a light emitting device including a light emitting chip disposed on a support surface and underfill comprising underfill material disposed in a gap between the support surface and the chip. For comparison, a profile of underfill that includes a fillet or band of underfill material around the sidewalls of the chip is drawn in phantom using dashed lines.

With reference to FIG. 1, a generally planar light emitting chip 10 includes a substrate 12 on which is disposed or attached a light-emitting device structure 14. In some embodiments, the device structure 14 includes a plurality of semiconductor layers configured to define a light emitting structure, such as a pn junction, and the semiconductor layers are formed on the substrate by epitaxial deposition or growth, by controlled implantation or diffusion of impurities into a topmost portion of the substrate 12, or so forth. In some embodiments, the device structure 14 includes a plurality of epitaxially deposited group III-nitride semiconductor layers, and the substrate 12 is a crystalline substrate made of sapphire or silicon carbide substrate. In some embodiments, the device structure 14 includes a plurality of epitaxially deposited group III-group V (III-V) semiconductor layers, and the substrate 12 is a crystalline substrate made of gallium arsenide or gallium phosphide. In some embodiments the device structure 14 includes a plurality of semiconductor layers formed by epitaxial growth on a substrate other than the substrate 12, and the device structure 14 is disposed after epitaxial growth on the substrate 12 which serves as a host substrate using a suitable wafer transfer process. These are merely example embodiments of the device structure 14 and substrate 12, and other light-emitting device structures can be used. Moreover, it will be appreciated that the light emitting device structure 14 may include various features such as metallic electrodes, one or more lithographically defined mesas, dielectric layers, or so forth.

The term "light emitting chip" as used herein is intended to denote a physically discrete component configured to be electrically energized to emit light. It is contemplated for a chip to be a physically discrete component that includes a plurality of monolithically integrated light emitting structures, such as a plurality of light emitting mesas. In embodiments in which the device structure 14 is a thin crystalline structure, term "lattice matched substrate" as used herein is intended to encompass any substrate that is capable of supporting epitaxial growth of such a thin crystalline device structure. As such, the term "lattice matched substrate" as used herein is intended to encompass substrates having a small lattice mismatch respective to the epitaxial layers (e.g., a mismatch of typically less than 8%, and more preferably less than 4%, still more preferably less than 2%, and still more preferably less than 1%), and is further intended to encompass substrates having a different crystallographic pattern or orientation as compared with the epitaxial layers, such as cubic group III-nitride epitaxial layers on a (0001) hexagonal sapphire substrate.

In some embodiments, the light emitting chip 10 is generally planar in that it has a generally planar aspect ratio with a thickness $t_{chip}$ substantially smaller than a lateral dimension $L_{chip}$. For example, in some embodiments $t_{chip}$ may be 0.3 millimeters while $L_{chip}$ may be 1.0 millimeter. In other example embodiments, $t_{chip}$ may be smaller than 0.3 millimeters, e.g. 5-30 microns. It is also contemplated for the light emitting chip 10 to have a cubic or other non-planar shape, such as a cube of 0.3 millimeters on a side.

The light emitting chip 10 is disposed on a support surface 20, which may for example be a surface of a sub-mount, a printed circuit board, a metal-core printed circuit board, or another support. A plurality of bonding bumps 22 are disposed in a gap between the light emitting chip 10 and the support surface 20. The plurality of bonding bumps 22 provide at least one electrical power input path to the light emitting chip 10. In the illustrated embodiment, the plurality of bonding bumps 22 provide all electrical power input paths to the light emitting chip 10; however, it is also contemplated for the light emitting chip 10 to be a vertical chip that includes a top-side electrode $22_v$ electrically contacted by a wire bond $22_w$ (shown in phantom). In such a vertical chip configuration, the substrate 12 should be electrically conducting, or should be removed (see FIG. 5 and related discussion). In the illustrated embodiment (omitting the phantom elements $22_v$, $22_w$), the light emitting chip 10 is mounted by flip-chip bonding to the support surface 20, such that the substrate 12 is distal from the support surface 20 and the device structure 14 is proximate to the support surface 20. In such a flip-chip configuration, light generated by the device structure 14 passes through and is extracted from the substrate 12, or travels laterally to be side-emitted, that is, extracted from the sides of the light emitting chip 10. As is known in the art, such side-emission can be a substantial fraction of the total light output.

An underfill 30 comprising underfill material is also disposed in the gap between the light emitting chip 10 and the support surface 20. The underfill 30 substantially fills the gap, and provides at least one of (i) mechanical support for the light emitting chip 10 and (ii) a thermal conduction path from the light emitting chip 10 to the support surface 20. Typically, the underfill 30 provides both mechanical support for the light emitting chip 10 and a thermal conduction path from the light emitting chip 10 to the support surface 20.

In the case of light emitting chips such as the illustrated light emitting diode chip 10, the inventors have recognized that conventional underfill techniques have a substantial disadvantage. Using conventional underfill techniques, the underfill material typically fills the gap between the chip and the support surface, but also extends outside the gap over sidewalls 32 of the chip 10 to form a fillet or narrow band of underfill material $30_F$ (drawn in phantom in FIGS. 1 and 2 for explanatory purposes, but not present in the light emitting device and not part of the underfill 30) over the sidewalls 32 of the chip 10. A fillet or narrow band of underfill material is formed around the sidewalls by conventional underfill techniques due to the use of extra underfill material and the positive wetting angle of the underfill material respective to the material of the light emitting chip. An underfill material with a positive wetting angle respective to the chip material is desirable because it promotes wetting of the chip by the underfill material. If, on the other hand, an underfill material is used which has a negative wetting angle respective to the chip, the underfill material will tend to "bead up" rather than wet the chip, and will provide limited contact area with the chip. A fillet or band of underfill material as is typically produced by conventional underfill techniques is harmless or even advantageous for most semiconductor chips. On the other hand, incomplete underfill is detrimental because it compromises the structural support and/or thermal conduction pathway provided by the underfill. Accordingly, existing underfill techniques ensure complete underfill by providing injecting or applying enough underfill material to substantially fill the gap between the chip and the support surface and to additionally generate a fillet or narrow band of underfill material extending outside the gap and over sidewalls of the chip.

The inventors have recognized that having a fillet or band $30_F$ of underfill material extending outside the gap and over the sidewalls 32 of the light emitting chip 10 is problematic. A fillet $30_F$ of underfill material interferes with light extraction from the sidewalls 32, which can be substantial in the case of incoherent light emitters such as light emitting diode chips, side-emitting laser diode chips, and so forth. Moreover, the fillet $30_F$ can interfere with post-underfill processing such as encapsulation, sidewall shaping, application of optical coatings such as anti-reflection coatings, phosphor coatings, or the like, thinning or removing the substrate, or so forth.

Accordingly, the underfill 30 does not include a fillet $30_F$. The underfill 30 comprises underfill material disposed in the gap between the light emitting chip 10 and the support surface 20. The underfill 30 substantially fills the gap between the light emitting chip 10 and the support surface 20, but does not include a fillet $30_F$ extending outside the gap over the sidewalls 32 of the light emitting chip 10. The underfill 30 provides at least one of (i) mechanical support for the light emitting chip 10 and (ii) a thermal conduction path from the light emitting chip 10 to the support surface 20, and preferably provides both mechanical support for the light emitting chip 10 and a thermal conduction path from the light emitting chip 10 to the support surface 20.

The omitted fillet $30_F$ is a band of underfill material extending outside the gap over the sidewalls 32. Although the fillet $30_F$ is omitted, it is to be understood that the underfill 30 may optionally include a portion of underfill material $30_D$ (shown in FIG. 2) extending outside the gap over a localized region of one of the sidewalls 32 of the light emitting chip 10. For example, in some embodiments an injector such as a syringe needle 34 is used to inject the underfill material after flip-chip bonding of the chip 10 to the support surface 20. In such embodiments, the portion of underfill material $30_D$ may for example be an extraneous drop of underfill material that is left over as the injector 34 is withdrawn. The portion of underfill material $30_D$ is only over a limited area of one of the sidewalls 32, and accordingly does not substantially interfere with side-emitted light extraction or post-underfill processing such as encapsulation, sidewall shaping, application of optical coatings such as anti-reflection coatings, phosphor coatings, or the like, thinning or removing the substrate, or so forth. In the illustrated embodiment, not only is the fillet $30_F$ omitted, but the underfill 30 has an undercut 33 that exposes edges of the light emitting chip within the gap between the light emitting chip and the support surface. That is, the underfill 30 is not precisely coextensive with the area of the chip 10, but rather has a slightly smaller area. The undercut 33 ensures that the underfill 30 does not include a fillet extending over the sidewalls 32; however, it is also contemplated to have the underfill extend flush with the edges of the light emitting chip within the gap between the light emitting chip and the support surface, while not including a fillet.

Figure 2:
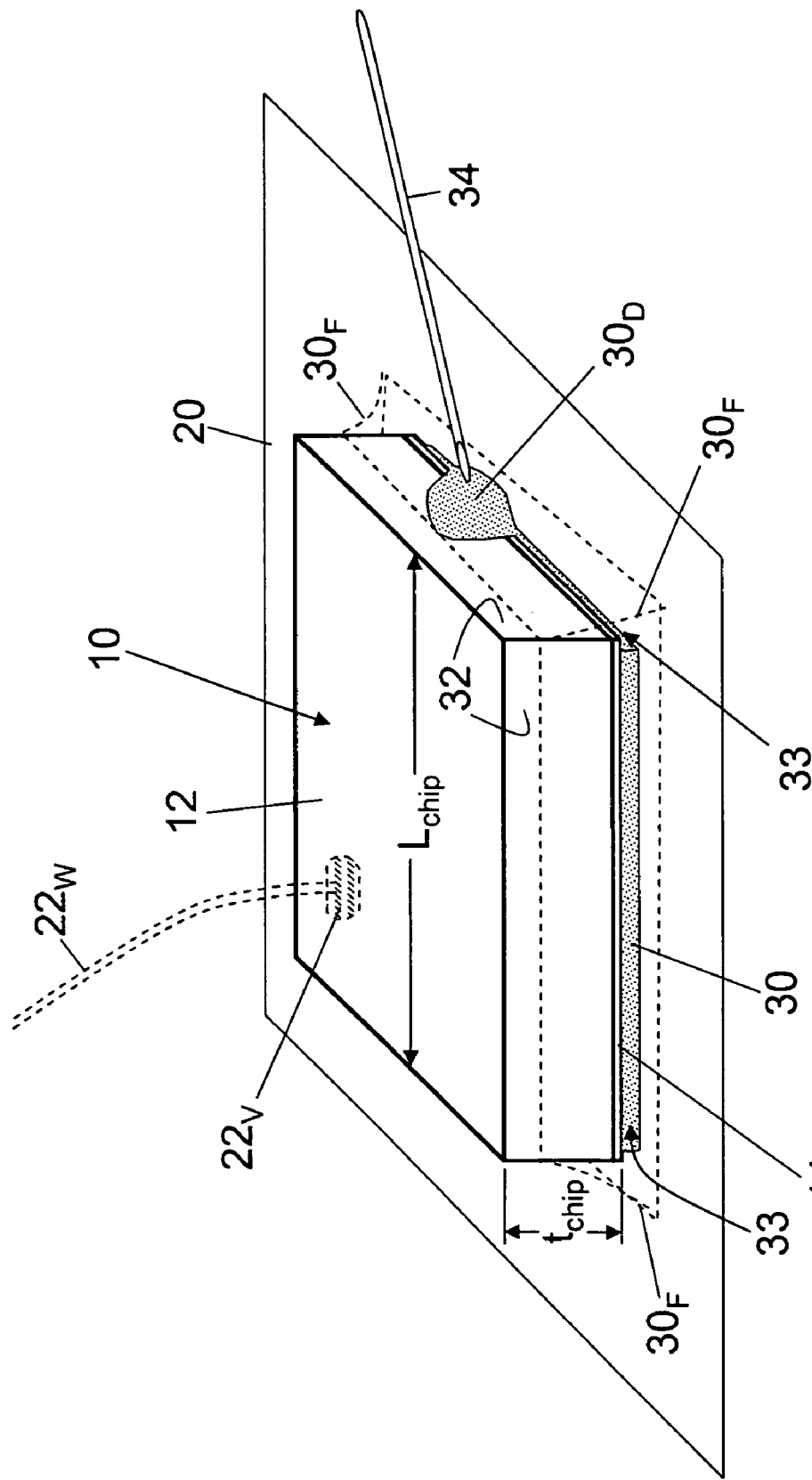

With reference to FIGS. 3-6, some modified light emitting devices are illustrated, which are based on the light emitting device of FIGS. 1 and 2 but which include modifications produced by selected post-underfill processing.

FIG. 3 diagrammatically shows the light emitting device of FIGS. 1 and 2, but with an additional encapsulant 40 applied after the flip-chip bonding and underfilling. The encapsulant 40 provides advantages such as optionally hermetically sealing the light emitting chip 10, providing lensing or other refractive optical effects, or so forth. The encapsulant 40 is substantially transparent to light produced by the light emitting chip 10, although optionally phosphor particles may be dispersed in some or all of the encapsulant 40 to produce selected wavelength conversion. The encapsulant 40 contacts at least most of the area of the sidewalls 32 of the light emitting chip 10. This contact is made possible because the underfill 30 omits the fillet $30_F$ so that the sidewalls 32 are substantially exposed during the encapsulation process. The illustrated encapsulant 40 includes shaped sidewalls 42 that are shaped to promote extraction of side emission light from the light emitting chip. Some example approaches for forming such shaped sidewalls 42 include shaping performed during dicing or separation of a sub-mount wafer or other support defining the support surface 20, such as are described in Chen et al., U.S. Pat. No. 6,964,877, and in Sackrison et al., U.S. Publ. Appl. No. 2006/0030125. Alternatively or additionally, the encapsulant can be shaped during formation using a suitable mold, or by lithographic processing, mechanical processing not involving separation or dicing of the sub-mount or other support, or so forth.

FIG. 4 diagrammatically shows the light emitting device of FIGS. 1 and 2, but with an additional optical coating 50 applied to the exposed distal surface and sidewalls of the light emitting chip 10 after the flip-chip bonding and underfilling. The optical coating 50 may, for example, be an anti-reflective coating, a phosphor coating for performing wavelength conversion, or so forth, and may optionally be a combination of different optical coatings. The optical coating 50 provides advantageous optical effects such as improved light extraction (in the case of an anti-reflective coating), selected spectral output modification (in the case of a phosphor coating), or so forth. The optical coating 50 contacts at least most of the area of the sidewalls 32 of the light emitting chip 10. This contact is made possible because the underfill 30 omits the fillet $30_F$ so that the sidewalls 32 are substantially exposed during application of the optical coating 50.

FIG. 5 diagrammatically shows a modified chip 10' that is produced from the chip 10 of the light emitting device of FIGS. 1 and 2 by removal of the substrate 12 after the flip-chip bonding and underfilling. For group III-nitride epitaxial layers deposited on lattice matched sapphire substrates, some suitable processes for removing the substrate 12 include laser lift off processes as described, for example, in Miskys et al., "Freestanding GaN Substrates and Devices", Phys. Stat. Sol. (c) 0, No. 6, pp. 1627 50 (2003), and Cheung et al., U.S. Pat. No. 6,071,795, or mechanical lapping, mechanical polishing, mechanical grinding, or so forth. Alternatively or additionally, the substrate can be removed by thinning or ablating the substrate away using a laser, or by a chemically-based liftoff process, or so forth. Instead of wholly removing the substrate 12, as shown in FIG. 5, the substrate 12 may instead be thinned. The underfill 30 does not include a fillet or band of underfill material extending outside the gap over sidewalls 32' of the plurality of epitaxial layers 14, which promotes side-emission light extraction from the chip 10'. Moreover, there is no fillet of underfill material prior to substrate thinning or removal, which facilitates performing lift-off or other thinning or removal of the substrate 12 after the underfilling.

FIG. 6 diagrammatically shows a modified chip 10" that is produced from the chip 10 of the light emitting device of FIGS. 1 and 2 by shaping sidewalls 32" to enhance extraction of side-emitted light. The extraction of side-emitted light is further enhanced by not having a fillet of underfill material extending over the sidewalls 32" of the light emitting chip. Some example approaches for forming such shaped sidewalls include shaping performed during dicing or separation of an epitaxial wafer, such as are described in Eliashevich et al., U.S. Pat. No. 7,078,319. Alternatively or additionally, the sidewalls can be shaped by cleaving, polishing, or so forth. Because there is no fillet of underfill material prior to shaping the sidewalls 32", the etching, cleaving, laser cutting, or other processing used to shape the sidewalls 32" is facilitated.

Figure 7:
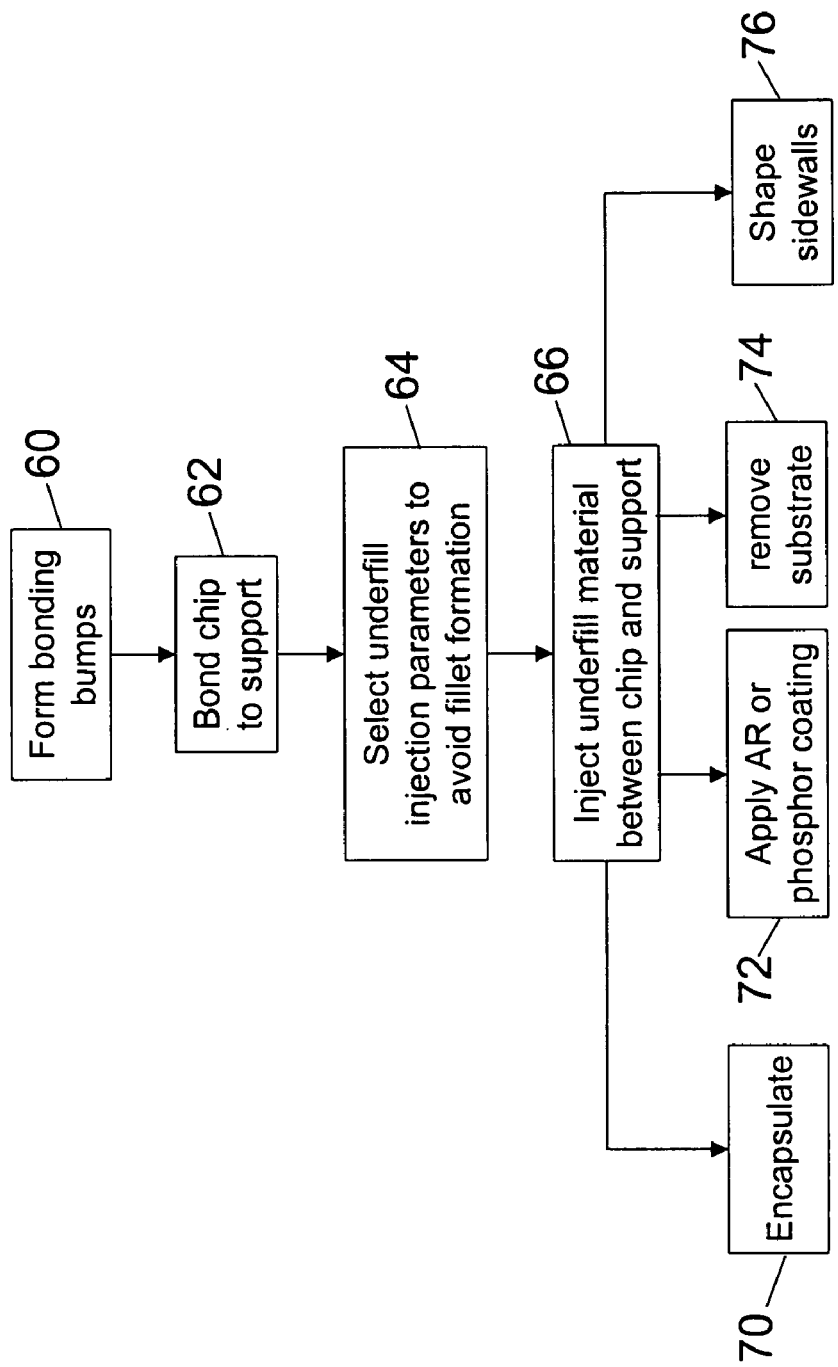
FIG. 7 diagrammatically shows one suitable process for manufacturing the light emitting devices of FIGS. 1-5.

With reference to FIG. 7, an approach for fabricating the light emitting devices of FIGS. 1-6 is described. In a process operation 60, the bonding bumps 22 are formed. The bonding bumps 22 may be formed on the support surface 20, or on the light emitting chip 10, or on both. In a process operation 62, the light emitting chip 10 is bonded to the support surface 20 via the bonding bumps 22, for example using soldering, thermocompressive bonding, thermosonic bonding, or so forth. The underfill is next performed using the syringe or other injector 34. In a process operation 64, underfill injection parameters are selected to enable an underfill material injection process operation 66 to produce the underfill 30 without overfilling the gap to form a fillet extending outside the gap over the sidewalls of the light emitting chip. The underfill material is injected in a substantially flowable form into the gap between the light emitting chip 10 and the support surface 20 such that the underfill material is drawn into and substantially fills the gap by a capillary effect. The underfill material converts to a solid or more viscous form after being disposed in the gap. For example, if an epoxy-based underfill material is used, then the epoxy components are suitably mixed in the syringe or injector 34 in a fluid form, and the injected epoxy then hardens, solidifies, or cures in the gap to form the underfill 30.

In some embodiments, the process operation 64 selects an amount of underfill material that is effective to substantially fill the gap between the light emitting chip 10 and the support surface 20 without overfilling the gap to form a fillet extending outside the gap over the sidewalls of the light emitting chip. In some embodiments, the process operation 64 selects a pressure of injection and an injection time that are effective to substantially fill the gap between the light emitting chip and the support surface without overfilling the gap to form a fillet extending outside the gap over the sidewalls of the light emitting chip. Other parameters that may be taken into account in the process operation 64 include viscosity of the flowable form of the underfill material, temperature, gap size (that is, the size of the separation between the chip 10 and support surface 20, adhesion properties between the underfill material and the materials of the chip 10 and support surface 20, and so forth.

It is also contemplated for the process operations 64, 66 to be performed concurrently. In such embodiments, the selection operation 64 is suitably a feedback control that monitors the amount of underfill material disposed in the gap and terminates the injecting when a sufficient amount of underfill material is injected to substantially fill the gap without overfilling to form a fillet. For example, the underfill material can be injected from one side of the gap, and the opposite or other side of the gap monitored using an optical or other sensor to detect when underfill material reaches a selected stopping position near the opposite edge of the gap. Injection is suitably terminated when the underfill material reaches the selected stopping position.

Whether the underfilling is controlled by pre-selection of parameters or by using feedback control, the underfilling advantageously takes into account the effect of withdrawing the syringe or other injector 34. For example, using the injector 34 an amount of underfill material is suitably injected that is not by itself effective to substantially fill the gap between the light emitting chip and the support surface. This amount can be determined by pre-selection of parameters or by feedback control. Then, when the injector 34 is withdrawn, an additional amount of underfill material is caused to be drawn out of the injector into the gap by the capillary effect. The injected amount and the additional amount of underfill material together are effective to substantially fill the gap between the light emitting chip 10 and the support surface 20.

After the underfill is disposed in the gap between the light emitting chip 10 and the support surface 20 by process operations 64, 66 such that the underfill 30 substantially fills the gap but does not form a fillet extending outside the gap over sidewalls of the light emitting chip, additional processing is optionally performed. For example, an encapsulation operation 70 can apply and optionally shape the encapsulant 40 of FIG. 3. In other embodiments, a coating operation 72 applies the optical coating 50 (such as an anti-reflection coating or a phosphor coating) to the exposed distal surface and sidewalls of the light emitting chip 10, as shown in FIG. 4. In other embodiments, a substrate removal process 74 is applied to lift off, thin or ablate away, or otherwise remove the substrate 12 from the chip 10 to produce the light emitting device shown in FIG. 5. In other embodiments, a sidewalls shaping process 76 is applied to shape the sidewalls 32" to produce the light emitting device shown in FIG. 6.

The processing diagrammatically shown in FIG. 7 is an example. While the process of FIG. 7 shows the underfill material applied after bonding the chip 10 to the support surface 20, in other contemplated embodiments the underfill material may be applied first, to the chip 10, the support surface 20, or both, such that when the chip 10 is bonded to the support surface 20 the underfill 30 suitably substantially fills the gap between the bonded chip 10 and the support surface 20 without forming a fillet extending outside the gap over sidewalls of the light emitting chip. Moreover, the optional optical coating process operation 72 and/or optional sidewalls shaping operation 76 may be performed before the bonding operation 62 and/or before the underfilling operations 64, 66. Other processing variations are also contemplated.

Embodiments including the preferred embodiments have been described. Obviously, modifications and alterations will occur to others upon reading and understanding the preceding detailed description. It is intended that the described embodiments be construed as including all such modifications and alterations insofar as they come within the scope of the appended claims or the equivalents thereof.

The invention claimed is:

1. A light emitting device comprising:
   a light emitting chip disposed on a support surface;
   a plurality of bonding bumps disposed in a gap between the light emitting chip and the support surface, the plurality of bonding bumps providing at least one electrical power input path to the light emitting chip; and
   an underfill comprising underfill material disposed in the gap between the light emitting chip and the support surface, the underfill substantially filling the gap but not including a fillet extending outside the gap over sidewalls of the light emitting chip, the underfill providing at least one of (i) mechanical support for the light emitting chip and (ii) a thermal conduction path from the light emitting chip to the support surface;
   wherein the light emitting chip comprises:
       a plurality of epitaxial layers, the underfill not including a fillet extending outside the gap over sidewalls of the plurality of epitaxial layers, and
       a lattice-matched substrate on which the plurality of epitaxial layers is disposed, the plurality of epitaxial layers being lattice matched with the lattice matched substrate, the light emitting chip being flip chip bonded to the support by the plurality of bonding bumps such that the plurality of epitaxial layers is proximate to the support surface and the lattice matched substrate is distal from the support surface.

2. The light emitting device as set forth in claim 1, further comprising at least one of:
   an encapsulant disposed over the light emitting chip, the encapsulant contacting at least most of the area of the sidewalls of the light emitting chip and being shaped to promote extraction of side emission light from the light emitting chip,
   an anti-reflection coating disposed on the light emitting chip including at least most of the area of the sidewalls of the light emitting chip, and
   a phosphor coating disposed on the light emitting chip including at least most of the area of the sidewalls of the light emitting chip.

3. The light emitting device as set forth in claim 1, wherein the sidewalls of the light emitting chip are shaped as slanted sidewalls to enhance extraction of side emitted light.

4. The light emitting device as set forth in claim 1, wherein the underfill has an undercut that exposes edges of the light emitting chip within the gap between the light emitting chip and the support surface.

5. The light emitting device as set forth in claim 1, wherein the plurality of bonding bumps provide all electrical power input paths to the light emitting chip.

6. The light emitting device as set forth in claim 1, wherein the underfill material comprises:
   an epoxy or silica based material with coefficient of thermal expansion (CTE) lowering particles dispersed in the epoxy or silica based material.

7. A light emitting device comprising:
   a light emitting chip disposed on a support surface, wherein the light emitting chip includes a plurality of epitaxial layers and does not include a substrate on which the plurality of epitaxial layers is disposed;
   a plurality of bonding bumps disposed in a gap between the light emitting chip and the support surface, the plurality of bonding bumps providing at least one electrical power input path to the light emitting chip; and
   an underfill comprising underfill material disposed in the gap between the light emitting chip and the support surface, the underfill substantially filling the gap but not including a fillet extending outside the gap over sidewalls of the plurality of epitaxial layers of the light emitting chip, the underfill providing at least one of (i) mechanical support for the light emitting chip and (ii) a thermal conduction path from the light emitting chip to the support surface.

8. The light emitting device as set forth in claim 7, wherein the underfill has an undercut that exposes edges of the light emitting chip within the gap between the light emitting chip and the support surface.

9. The light emitting device as set forth in claim 7, wherein the plurality of bonding bumps provide all electrical power input paths to the light emitting chip.

10. The light emitting device as set forth in claim 7, wherein the underfill material comprises:
   an epoxy or silica based material with coefficient of thermal expansion (CTE) lowering particles dispersed in the epoxy or silica based material.

\* \* \* \* \*